United States Patent
Kitano et al.

(10) Patent No.: US 9,853,183 B2
(45) Date of Patent: Dec. 26, 2017

(54) METHOD FOR MANUFACTURING LIGHT EMITTING ELEMENT AND LIGHT EMITTING ELEMENT

(71) Applicant: EL-SEED CORPORATION, Nagoya-shi (JP)

(72) Inventors: Tsukasa Kitano, Nagoya (JP); Koichi Naniwae, Nagoya (JP)

(73) Assignee: EL-SEED CORPORATION, Nagoya-Shi, Aichi (JP)

( * ) Notice: Subject to any disclaimer, the term of this patent is extended or adjusted under 35 U.S.C. 154(b) by 0 days.

(21) Appl. No.: 15/311,981

(22) PCT Filed: Jun. 4, 2015

(86) PCT No.: PCT/JP2015/066149
§ 371 (c)(1),
(2) Date: Nov. 17, 2016

(87) PCT Pub. No.: WO2015/194382
PCT Pub. Date: Dec. 23, 2015

(65) Prior Publication Data
US 2017/0133548 A1    May 11, 2017

(30) Foreign Application Priority Data

Jun. 17, 2014 (JP) .................... 2014-124695
Nov. 13, 2014 (JP) .................... 2014-230912
Mar. 18, 2015 (JP) .................... 2015-055101

(51) Int. Cl.
*H01L 33/00* (2010.01)
*H01L 33/22* (2010.01)
(Continued)

(52) U.S. Cl.
CPC ........ *H01L 33/0075* (2013.01); *H01L 33/007* (2013.01); *H01L 33/22* (2013.01); *H01L 33/32* (2013.01); *H01L 33/46* (2013.01)

(58) Field of Classification Search
CPC ..... H01L 33/0075; H01L 33/32; H01L 33/22; H01L 33/325; H01L 33/20
See application file for complete search history.

(56) References Cited

U.S. PATENT DOCUMENTS

2003/0183160 A1    10/2003  Fujikura et al.
2004/0113166 A1*   6/2004   Tadatomo ........... H01L 33/22
                                                 257/98
(Continued)

FOREIGN PATENT DOCUMENTS

EP    2 477 238 A1    7/2012
JP    2000-106455 A   4/2000
(Continued)

OTHER PUBLICATIONS

International Search Report (ISR) (PCT Form PCT/ISA/210), in PCT/JP2015/066149, dated Aug. 18, 2015.
(Continued)

*Primary Examiner* — Roy Potter
*Assistant Examiner* — Paul Patton
(74) *Attorney, Agent, or Firm* — McGinn IP Law Group, PLLC

(57) ABSTRACT

A light emitting element manufacturing method of allowing a semiconductor laminated part which includes a light emitting layer and includes a group-III nitride semiconductor to grow on a substrate surface in which protrusions are formed in a period which is larger than an optical wavelength of light emitted from the light emitting layer and is smaller than a coherent length of the light, includes: forming a buffer layer along the substrate surface having the protru- (Continued)

sions; allowing crystal nuclei which have facet surfaces and are separated from each other to grow on the buffer layer such that the crystal nuclei include at least one protrusion; and allowing a planarization layer to grow on the buffer layer in which the crystal nuclei are formed.

6 Claims, 11 Drawing Sheets

(51) Int. Cl.
*H01L 33/32* (2010.01)
*H01L 33/46* (2010.01)

(56) References Cited

U.S. PATENT DOCUMENTS

| 2007/0096147 A1 | 5/2007 | Oshima |
| 2012/0228656 A1 | 9/2012 | Kamiyama et al. |
| 2013/0221388 A1 | 8/2013 | Tanaka |
| 2015/0137173 A1 | 5/2015 | Komada |

FOREIGN PATENT DOCUMENTS

| JP | 2002-246698 A | 8/2002 |
| JP | 2003-277196 A | 10/2003 |
| JP | 2006-319277 A | 11/2006 |
| JP | 2007-126320 A | 5/2007 |
| JP | 2013-175553 A | 9/2013 |
| WO | WO 2011/009093 A2 | 1/2011 |
| WO | WO 2011/027679 A1 | 3/2011 |
| WO | WO 2013/054916 A1 | 4/2013 |
| WO | WO 2014/065019 A1 | 5/2014 |

OTHER PUBLICATIONS

Notification of Reason(s) for refusal dated Aug. 18, 2014 (an office action of related Japanese application No. 2014-124695), and its English translation.

Notification of Reason(s) for refusal dated Jan. 20, 2015 (an office action of related Japanese application No. 2014-230912), and its English translation.

Notification of Reason(s) for refusal dated Oct. 15, 2015 (an office action of related Japanese application No. 2015-055101), and its English translation.

Supplementary Extended European Search Report dated Aug. 1, 2017 in European Application No. 15809642.0.

Hyoungwon Park, et al.; "Enhancement of photo-and electroluminescence of $G_aN$-based LED structure grown on a nanometer-scaled patterned sapphire substrate", Microelectronic Engineering, Elsevier Publishers BV., Amsterdam, NL, vol. 88, No. 11, Jul. 29, 2011 (Jul. 29, 2017), pp. 3207-3213, XP028109505, ISSN: 0167-9317. DOI: 10.1016/J.MEE.2011.07.014 [retrieved on Aug. 22, 2011].

* cited by examiner

FIG. 3
(a)
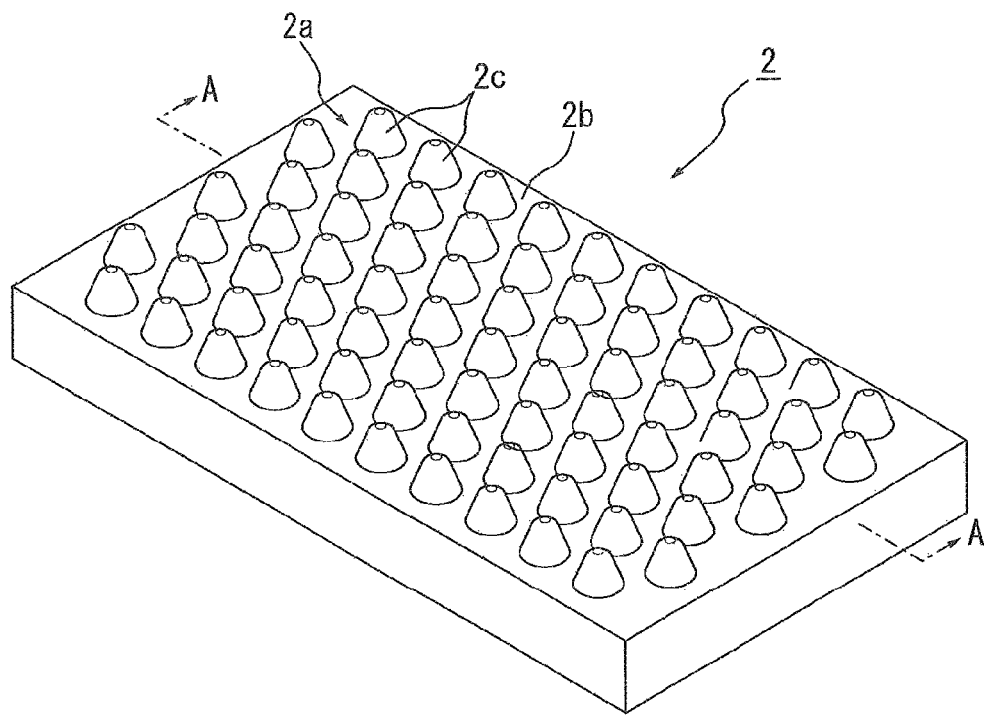
(b)
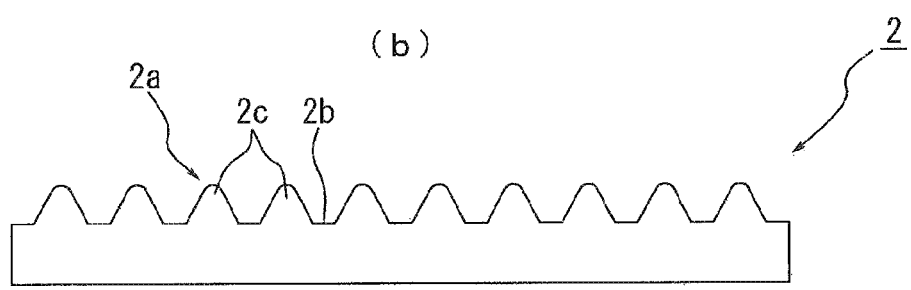
(c)
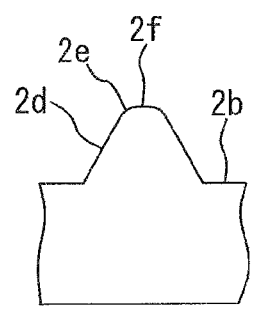

F I G. 1 2
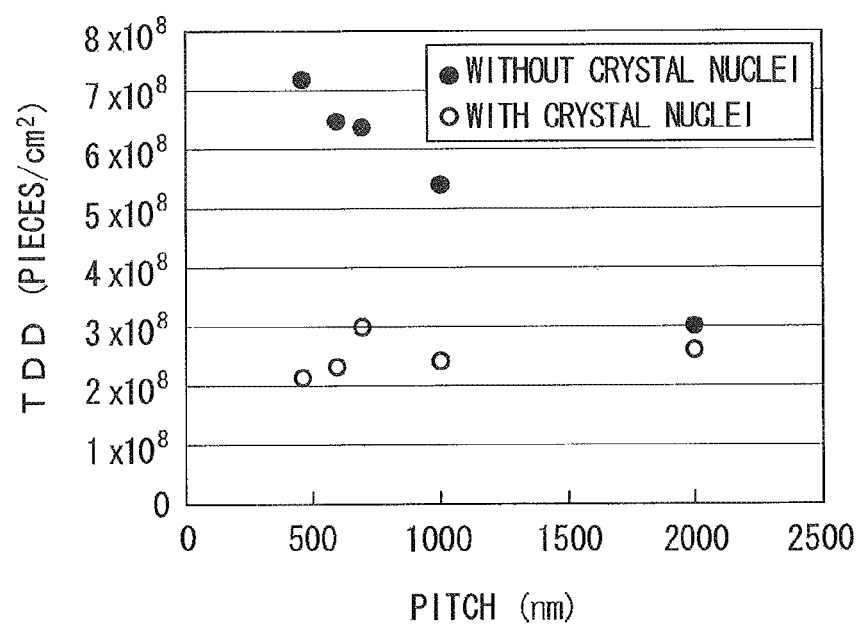

F I G. 1 4
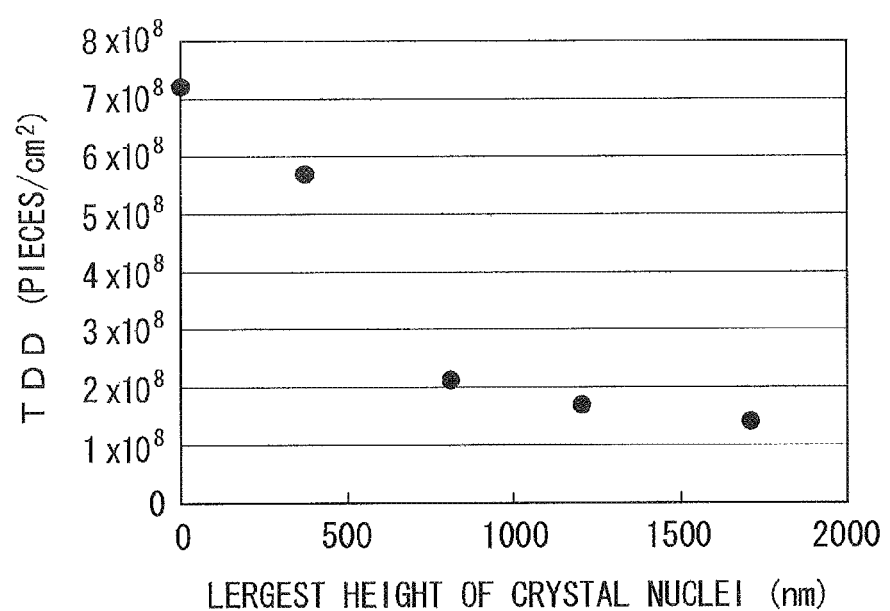

METHOD FOR MANUFACTURING LIGHT EMITTING ELEMENT AND LIGHT EMITTING ELEMENT

TECHNICAL FIELD

The present invention relates to a method for manufacturing light emitting element and light emitting element.

BACKGROUND ART

An LED element including a group-III nitride semiconductor that is formed on the front surface of a sapphire substrate and includes a light emitting layer, a diffractive surface that is formed on the front surface of the sapphire substrate so that light emitted from the light emitting layer is incident thereon and has recesses or protrusions whose period is larger than an optical wavelength of the light and is smaller than the coherence length of the light, and an Al reflective film that is formed on a back surface of the substrate so as to reflect the light diffracted by the diffractive surface so that the light is incident on the diffractive surface again is known (see Patent Literature 1). With this LED element, light transmitted by the diffraction effect is incident on the diffractive surface again and is transmitted through the diffractive surface again by the diffraction effect, whereby the light can be extracted outside the element in a plurality of modes.

CITATION LIST

Patent Literature

Patent Literature 1: WO2011/027679

SUMMARY OF INVENTION

Technical Problem

However, it was confirmed that, when recesses or protrusions were formed on a front surface of a substrate in such a period as to form a diffractive surface, and then, a group-III nitride semiconductor was grown on the front surface, the crystal quality of the group-III nitride semiconductor changed greatly depending on the pitch of recesses or protrusions.

The present invention is made in view of the above-described circumstances, and its object is to provide a light emitting element manufacturing method capable of suppressing a change in the crystal quality of a group-III nitride semiconductor depending on the pitch of recesses or protrusions even when a substrate having recesses or protrusions formed in a front surface thereof in a period as to form a diffractive surface is used and to provide a light emitting element manufactured by the manufacturing method.

Solution to Problem

In order to achieve the above-described object, the present invention provides a light emitting element manufacturing method of allowing a semiconductor laminated part which includes a light emitting layer and comprises a group-III nitride semiconductor to grow on a substrate surface in which protrusions are formed in a period which is larger than an optical wavelength of light emitted from the light emitting layer and is smaller than a coherent length of the light, comprising: forming a buffer layer along the substrate surface having the protrusions; allowing crystal nuclei which have facet surfaces and are separated from each other to grow on the buffer layer such that the crystal nuclei include at least one protrusion; and allowing a planarization layer to grow on the buffer layer in which the crystal nuclei are formed.

In the light emitting element manufacturing method, the crystal nuclei may have a flat upper surface.

In the light emitting element manufacturing method, the buffer layer may be formed by sputtering which uses MN as a target.

In the light emitting element manufacturing method, the crystal nuclei may be grown to a height of 900 nm or smaller.

In the light emitting element manufacturing method, the semiconductor laminated part may include the buffer layer, the crystal nuclei and the planarization layer; and an oxygen concentration in the crystal nuclei may be higher than that of the planarization layer.

Advantageous Effects of Invention

According to the present invention, it is possible to suppress a change in the crystal quality of a group-III nitride semiconductor depending on the pitch of recesses or protrusions even when a substrate having recesses or protrusions formed in a front surface thereof in a period as to form a diffractive surface is used.

BRIEF DESCRIPTION OF DRAWINGS

FIG. 3 illustrate a sapphire substrate, in which (a) is a schematic perspective view, (b) is a schematic explanatory view taken along with the A-A line, and (c) is a schematic enlarged explanatory view;

FIG. 12 is a graph illustrating the relation between the pitch of protrusions and a threading dislocation density in a sample in which crystal nuclei are formed and a sample in which crystal nuclei are not formed.

FIG. 14 is a graph illustrating the relation between the largest height of the crystal nuclei and the threading dislocation density.

DESCRIPTION OF EMBODIMENTS

Figure 1:
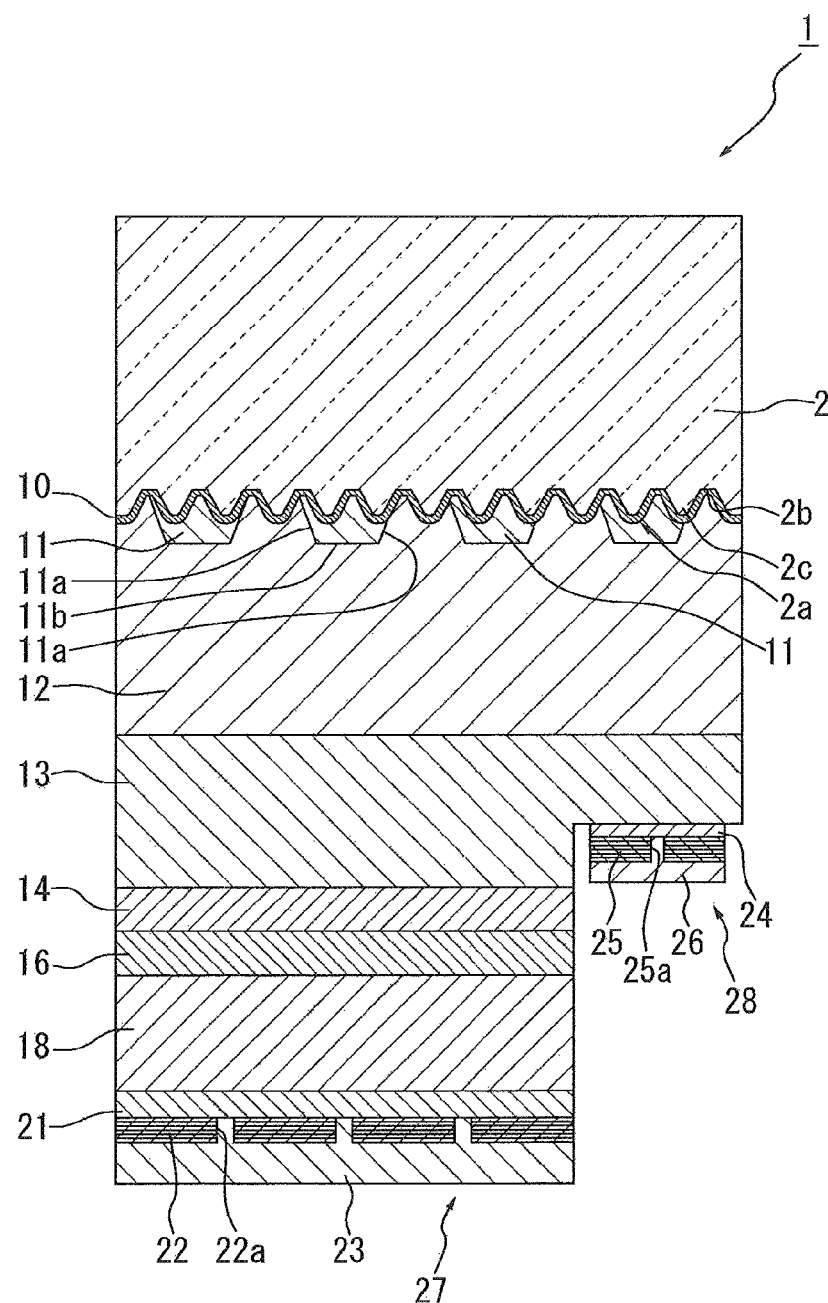
FIG. 1 is a schematic sectional view of an LED element according to an embodiment of the present invention.

FIG. 1 is a schematic sectional view of an LED element according to an embodiment of the present invention.

As illustrated in FIG. 1, an LED element 1 is an element in which a semiconductor laminated part 19 comprising a group-III nitride semiconductor layer is formed on a front surface of a sapphire substrate 2. This LED element 1 is a flip-chip type LED element, and light is mainly extracted from a back surface of the sapphire substrate 2. The semiconductor laminated part 19 has a buffer layer 10, a planarization layer 12, an n-type GaN layer 13, a light emitting layer 14, an electron blocking layer 16, and a p-type GaN layer 18 which are laminated in this order from the side of the sapphire substrate 2. A p-side electrode 27 is formed on the p-type GaN layer 18, and an n-side electrode 28 is formed on the n-type GaN layer 12.

As illustrated in FIG. 1, the buffer layer 10 is formed on the front surface of the sapphire substrate 2 and comprises AlN. The buffer layer 10 is formed on the substrate front surface having protrusions 2c, and recesses and protrusions are continued in a front surface of the buffer layer 10. In the present embodiment, the buffer layer 10 is formed by an MOCVD (Metal Organic Chemical Vapor Deposition) method, but may be formed by a sputtering method. In case of a sputtering method, a sputtering using AlN as a target is more preferable than a reactive sputtering using Al as a target. In case of the reactive sputtering using Al as a target, a high temperature may cause a negative influence of a covering state of the substarate surface. Further, a machine is complicated and a manufactureing cost increases because a high temperature and high vacuum are needed. In contrast, in case of the sputtering using MN as a target, there is no risk of these problems. The planarization layer 12 is formed on the buffer layer 10 and comprises undoped u-GaN. The n-type GaN layer 13 as a first conductivity-type layer is formed on the planarization layer 12 and comprises n-GaN. The light emitting layer 14 is formed on the n-type GaN layer 13, comprises GaInN/GaN and emits blue light by electron and hole injection. Here, the blue light is, for example, light whose peak wavelength is 430 nm or more to 480 nm or less. In the present embodiment, the peak wavelength of the light emitted from the light emitting layer 14 is 450 nm.

The electron blocking layer 16 is formed on the light emitting layer 14 and comprises p-AlGaN. The p-type GaN layer 18 as a second conductivity-type layer is formed on the electron blocking layer 16 and comprises p-GaN. The layers ranging from the buffer layer 10 to the p-type GaN layer 18 are formed by epitaxial growth of the group-III nitride semiconductor. The layer configuration of the semiconductor layer is optional as long as the semiconductor layer includes at least a first conductivity-type layer, an active layer, and a second conductivity-type layer, and the active layer emits light by electron-hole recombination when a voltage is applied to the first conductivity-type layer and the second conductivity-type layer.

The front surface of the sapphire substrate 2 forms a verticalized moth eye surface 2a. A planar part 2b and a plurality of protrusions 2c that are periodically formed on the planar part 2b are formed on the front surface of the sapphire substrate 2. In the present embodiment, a semiconductor laminated part 19 is formed without space around protrusions 2c. Examples of the shape of protrusions 2c include a pyramidal shape such as a conical shape or a polygonal pyramidal shape and a truncated pyramidal shape obtained by cutting the top of a pyramid such as a truncated conical shape or a truncated polygonal pyramidal shape. Protrusions 2c are designed to diffract light emitted from the light emitting layer 14. In the present embodiment, the light verticalizing effect can be obtained by the protrusions 2c disposed periodically. Here, the light verticalizing effect means an effect by which light intensity distribution after the light is reflected from and transmitted through the verticalized moth eye surface is inclined closer to the direction vertical to the interface between the sapphire substrate 2 and the semiconductor laminated part 19 than before the light is incident on the verticalized moth eye surface.

Figure 2:
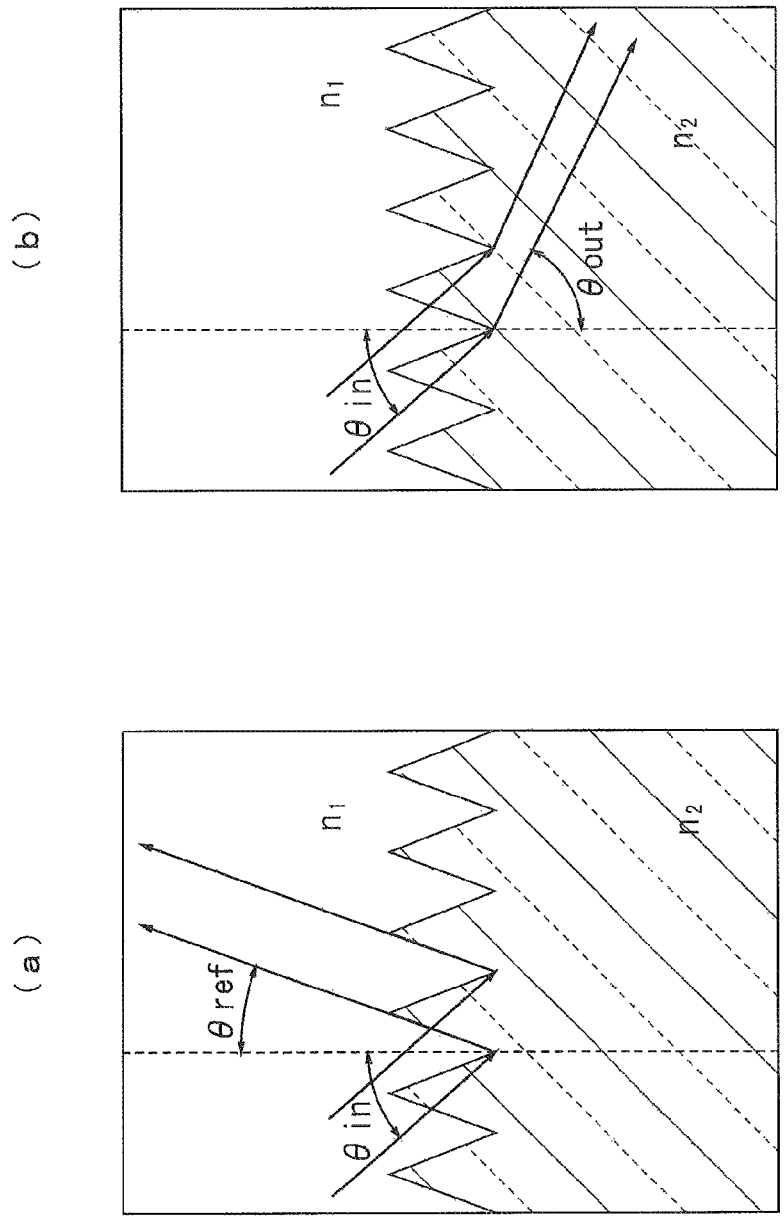
FIG. 2 is an explanatory view illustrating the diffraction effect of light at an interface between media having different indices of refraction, in which (a) illustrates a state where light is reflected from the interface, and (b) illustrates a state where light passes through the interface.

FIG. 2 is an explanatory view illustrating the diffraction effect of light at an interface between media having different indices of refraction, in which (a) illustrates a state where light is reflected from the interface, and (b) illustrates a state where light passes through the interface.

Here, from the Bragg diffraction condition, the condition to be satisfied by the angle of reflection $\theta_{ref}$ with respect to the angle of incidence $\theta_{in}$ when light is reflected from the interface is as follows.

$$d \times n_1 \times (\sin\theta_{in} - \sin\theta_{ref}) = m \times \lambda \quad (1)$$

Here, $n_1$ is an index of refraction of a medium on the incident side, $\lambda$ is a wavelength of incident light, and m is an integer. When light is incident on the sapphire substrate 2 from the semiconductor laminated part 19, $n_1$ is the index of refraction of the group-III nitride semiconductor. As illustrated in FIG. 2(a), light incident on the interface is reflected at the angle of reflection $\theta_{ref}$ that satisfies the above-described expression (1).

Meanwhile, from the Bragg diffraction condition, the condition to be satisfied by the angle of transmission $\theta_{out}$ with respect to the angle of incidence $\theta_{in}$ when light is transmitted through the interface is as follows.

$$d \times (n_1 \times \sin\theta_{in} - n_2 \times \sin\theta_{out}) = m' \times \lambda \quad (2)$$

Here, $n_2$ is an index of refraction of a medium on the output side, and m' is an integer. When, for example, light is incident on the sapphire substrate 2 from the semiconductor laminated part 19, $n_2$ is the index of refraction of sapphire. As illustrated in FIG. 2(b), the light incident on the interface is transmitted at the angle of transmission $\theta_{out}$ that satisfies the above-described expression (2).

For existing the angle of reflection $\theta_{ref}$ that satisfies the above-described expression (1) and the angle of transmission $\theta_{out}$ that satisfies the above-described expression (2), the period of the front surface of the sapphire substrate 2 should be larger than $(\lambda/n_1)$ or $(\lambda/n_2)$ that is an optical wavelength at the inside of element. Thus, for existing the diffraction light, the front surface of the sapphire substrate 2 is designed such that the period is larger than $(\lambda/n_1)$ or $(\lambda/n_2)$.

As illustrated in FIG. 1, the p-side electrode 27 includes a diffusion electrode 21 that is formed on the p-type GaN layer 18, a dielectric multilayer film 22 that is formed on a predetermined region of the diffusion electrode 21, and a metal electrode 23 that is formed on the dielectric multilayer film 22. The diffusion electrode 21 is formed on the entire surface of the p-type GaN layer 18 and comprises a transparent material such as ITO (Indium Tin Oxide), for example. The dielectric multilayer film 22 is formed by repeatedly laminating a plurality of pairs of a first material and a second material having different indices of refraction. For example, the dielectric multilayer film 22 may have five pairs of the first material of $ZrO_2$ (index of refraction 2.18) and the second material of $SiO_2$ (index of refraction 1.46). It should be noted that materials other than $ZrO_2$ and $SiO_2$ may be used to form the dielectric multilayer film 22, and MN (index of refraction 2.18), Nb$_2$O$_3$ (index of refraction 2.4), Ta$_2$O$_3$ (index of refraction 2.35) or the like may be used, for example. The metal electrode 23 covers the dielectric multilayer film 22 and comprises a metal material such as Al, for example. The metal electrode 23 is electrically connected to the diffusion electrode 21 through a via-hole 22a formed in the dielectric multilayer film 22.

The n-side electrode 28 is formed on the n-type GaN layer 12 exposed after etching the p-type GaN layer 18 to form the n-type GaN layer 12. The n-side electrode 28 includes a diffusion electrode 24 that is formed on the n-type GaN layer 12, a dielectric multilayer film 25 that is formed on a predetermined region of the diffusion electrode 24, and a metal electrode 26 that is formed on the dielectric multilayer film 25. The diffusion electrode 24 is formed on the entire surface of the n-type GaN layer 12 and comprises a transparent material such as ITO (Indium Tin Oxide), for example. The dielectric multilayer film 25 is formed by repeatedly laminating a plurality of pairs of a first material and a second material having different indices of refraction. The dielectric multilayer film 25 may have five pairs of the first material of ZrO$_2$ (index of refraction 2.18) and the second material of SiO$_2$ (index of refraction 1.46), for example. It should be noted that materials other than ZrO$_2$ and SiO$_2$ may be used to form the dielectric multilayer film 25, and AlN (index of refraction 2.18), Nb$_2$O$_3$ (index of refraction 2.4), Ta$_2$O$_3$ (index of refraction 2.35) or the like may be used, for example. The metal electrode 26 covers the dielectric multilayer film 25 and comprises a metal material such as Al, for example. The metal electrode 26 is electrically connected to the diffusion electrode 24 through a via-hole 25a formed in the dielectric multilayer film 25.

In this LED element 1, the p-side electrode 27 and the n-side electrode 28 form a reflecting part. Reflectivity of the p-side electrode 27 and the n-side electrode 28 increases as the angle comes closer to the vertical angle. Light that is reflected from the verticalized moth eye surface 2a of the sapphire substrate 2 and changes its angle so as to be directed closer to the direction vertical to the interface, as well as light emitted from the light emitting layer 14 and incident directly on the reflecting part is incident on the reflecting part. That is, the intensity distribution of light incident on the reflecting part is in a state of being inclined closer to the vertical direction as compared to the case where the front surface of the sapphire substrate 2 is planar.

Next, the sapphire substrate 2 will be described in detail with reference to FIG. 3. FIG. 3 illustrate the sapphire substrate, in which (a) is a schematic perspective view, (b) is a schematic explanatory view taken along with the A-A line, and (c) is a schematic enlarged explanatory view.

In the verticalized moth eye surface 2a, as illustrated in FIG. 3(a), the protrusions 2c are formed to align at points of intersection of a virtual triangle lattice with the predetermined period, so that the centers of the protrusions 2c are positioned at vertices of regular triangles in planar view. The protrusions 2c may be disposed so that the centers of the protrusions 2c are positioned at the vertices of isosceles triangles. The period of the protrusions 2c is greater than an optical wavelength of light emitted from the light emitting layer 14, and is smaller than coherent length of the light. It should be noted that the period in this case means the distance between the adjacent protrusions 2c at the position having the peak height. Further, the optical wavelength means the value obtained by dividing the actual wavelength by the index of refraction. Furthermore, the coherent length corresponds to the distance until the coherence eliminates as periodic vibrations of the waves are cancelled due to difference in the respective wavelengths in a photon group of the predetermined spectrum width. Supposing that the wavelength of light is $\lambda$ and the half-value width of the light is $\Delta\lambda$, coherent length 1c roughly has the relationship of $1c=(\lambda^2/\Delta\lambda)$. When the period of the protrusions 2c is one or more time greater than the optical wavelength, the diffraction operation gradually and effectively starts to act on the incident light having the angle of the critical angle or more, and when the period is two or more times greater than the optical wavelength of the light emitted from the light emitting layer 14, the number of transmission modes and reflection modes increases sufficiently, which is favorable. In addition, it is favorable that the period of the protrusions 2c is less than half the coherent length of the light emitted from the light emitting layer 14.

According to this embodiment, the length of one side of the regular triangles that form the virtual triangular lattice is 460 nm and the period of the protrusions 2c is 460 nm. The wavelength of light emitted from the light emitting layer 14 is 450 nm, and the index of refraction of the group-III nitride semiconductor layer is 2.4, and therefore its optical wavelength is 187.5 nm. Further, the half-value width of the light emitted from the light emitting layer 14 is 27 nm, and hence the coherent length of the light is 7500 nm. Namely, the period of the verticalized moth eye surface 2a is greater than twice the optical wavelength of the light emitting layer 14, and less than half the coherent length.

According to this embodiment, as illustrated in FIG. 3(c), protrusions 2c on the verticalized moth eye surface 2a include a side surface 2d that extends upward from the planar part 2b, a bent part 2e that bends and extends from the upper end of the side surface 2d toward the center side of the protrusion 2c, and a flat top surface 2f that is formed continuously from the bent part 2e. As will be described later, before the formation of the bent part 2e, the protrusion 2c, on which a corner is formed at a part associating the side surface 2d and the top surface 2f, is wet-etched and rounded, and thus the bent part 2e is formed. The wet-etching may be made until the flat top surface 2f eliminates and the entire upper side of the protrusion 2c becomes the bent part 2e. Specifically, according to this embodiment, the diameter of the base end part of protrusions 2c is 380 nm, and its height is 400 nm. In the verticalized moth eye surface 2a of the sapphire substrate 2, the planar part 2b is provided at the position where the protrusions 2c are not provided.

Here, a manufacturing method of the sapphire substrate 2 for the LED element 1 will be explained. The manufacturing method according to this embodiment includes a mask layer formation process, a resist film formation process, a pattern formation process, a residual film removal process, a resist alteration process, a mask layer etching process, a sapphire substrate etching process, a mask layer removal process, and a bent part formation process.

First, the sapphire substrate 2 before processing is provided. Prior to the etching, the sapphire substrate 2 is cleaned by the predetermined cleaning liquid. Then, a mask layer is formed on the sapphire substrate 2 (mask layer formation process). According to this embodiment, the mask layer includes a SiO$_2$ layer on the sapphire substrate, and a Ni layer on the SiO$_2$ layer. Incidentally, the mask layer may have a single layer. The mask layer is formed by the sputtering method, a vacuum deposition method, a CVD method, or the like.

Next, a resist film is formed on the mask layer (resist film formation process). According to this embodiment, the resist film is formed by thermoplastic resin, and is formed by a spin coating method to have the uniform thickness. It is also possible to use hotosetting resin other than thermoplastic resin as the resist film.

The resist film, together with the sapphire substrate 2, is heated and softened and, the resist film is pressed by a mold. A protrusion-and-recess structure is formed on the contact surface of the mold, and the resist film is deformed along the protrusion-and-recess structure. Thereafter, the resist film, while being pressed, is cooled and hardened, together with the sapphire substrate 2. The mold is then separated from the resist film and a protrusion-and-recess structure is transferred to the resist film (pattern formation process). According to this embodiment, the period of the protrusion-and-recess structure is 460 nm. Further, according to this embodiment, the diameter of a protrusion of the protrusion-and-recess structure is 100 nm or more and 300 nm or less, and is 230 nm, for example. Furthermore, the height of the protrusion is 100 nm or more and 300 nm or less, and is 250 nm, for example. In this state, a residual film is formed on a recess of the resist film.

The sapphire substrate 2, on which the resist film is formed as described above, is mounted on a substrate holding table of a plasma etching apparatus. Then, the residual film is removed by plasma ashing, for example, and the mask layer is exposed (residual film removal process). According to this embodiment, the $O_2$ gas is used as the processing gas for the plasma ashing.

Then, the resist film is exposed to plasma under an alteration condition, so as to alter the resist film and increase etch selectivity (resist alteration process). According to this embodiment, the Ar gas is used as the processing gas for altering the resist film. Further, with regard to the alteration condition according to this embodiment, bias output of the power supply for guiding the plasma to the sapphire substrate 2 side is set to be lower than that of a later-described etching condition.

Then, the resist film, having the high etch selectivity after being exposed to the plasma under the etching condition, is used as a mask to etch the mask layer (mask layer etching process). According to this embodiment, the Ar gas is used as the processing gas for etching the resist film. Thereby, a pattern is formed on the mask layer.

With regard to the alteration condition and the etching condition, it is possible to change the processing gas, antenna output, the bias output and the like as appropriate, but it is preferable to change the bias output by using the same processing gas, as in this embodiment. It should be noted that the hardening of the resist is possible when the antenna output is lowered or a gas flow rate is reduced, as well as when the bias output is lowered, with respect to the etching condition.

Next, the sapphire substrate 2 is etched by using the mask layer as a mask (sapphire substrate etching process). According to this embodiment, the etching is made while the resist film remains on the mask layer. Further, plasma etching is made by using a chlorine-based gas, such as a $BCl_3$ gas, as the processing gas.

When the etching progresses, the verticalized moth eye surface 2a is formed on the sapphire substrate 2. According to this embodiment, the height of the protrusion-and-recess structure on the verticalized moth eye surface 2a is 400 nm. Incidentally, the height of the protrusion-and-recess structure may be increased to be greater than 400 nm. When the height of the protrusion-and-recess structure is relatively small, such as 300 nm, for example, the etching may be finished while the remaining resist film exists.

Thereafter, the predetermined stripping liquid is used to remove the mask layer remaining on the sapphire substrate 2 (mask layer removal process). According to this embodiment, high-temperature nitric acid is used to remove the Ni layer, and then, hydrofluoric acid is used to remove the $SiO_2$ layer. When the resist film remains on the mask layer, it can be removed together with the Ni layer by the high-temperature nitric acid. However, when the remaining amount of the resist film is large, it is preferable to remove the resist film by $O_2$ ashing in advance.

Then, the corner on the protrusion 2c is removed by the wet-etching, so as to form the bent part (bent part formation process). Although the etching solution can be freely selected, it is possible to use the so-called "hot phosphoric acid" as phosphoric acid aqueous solution that is heated to about 170° C., for example. Incidentally, this bent part formation process can be omitted as appropriate. After the above-described processes, the sapphire substrate 2 having the protrusion-and-recess structure on its front surface is manufactured.

The semiconductor laminated part 19 formed by the group-III nitride semiconductor is formed by the epitaxial growth on thus-manufactured verticalized moth eye surface 2a of the sapphire substrate 2 (semiconductor formation process), on which the p-side electrode 27 and the n-side electrode 28 are formed (electrode formation process). Thereafter, the LED element 1 is manufactured by dicing and dividing into a plurality of the LED elements 1.

In the present embodiment, a group-III nitride semiconductor is laminated on the verticalized moth eye surface 2a of a sapphire substrate 2 in the order of a buffer layer 10, a planarization layer 12, an n-type GaN layer 13, a light emitting layer 14, an electron blocking layer 16, and a p-type GaN layer 18. It was confirmed that, when recesses or protrusions are formed on the surface of the sapphire substrate 2 in such a period as to form a diffractive surface, if the planarization layer 12 and the subsequent layers are grown under general growth conditions, the crystal quality of the group-III nitride semiconductor changed greatly depending on the pitch of recesses or protrusions. The present inventors have found that the change in the crystal quality of the group-III nitride semiconductor depending on the pitch of recesses or protrusions could be suppressed when a plurality of crystal nuclei 11 are grown under such growth conditions that formation of facets are accelerated more than the planarization layer 12 before the growth of the planarization layer 12.

Figure 5:
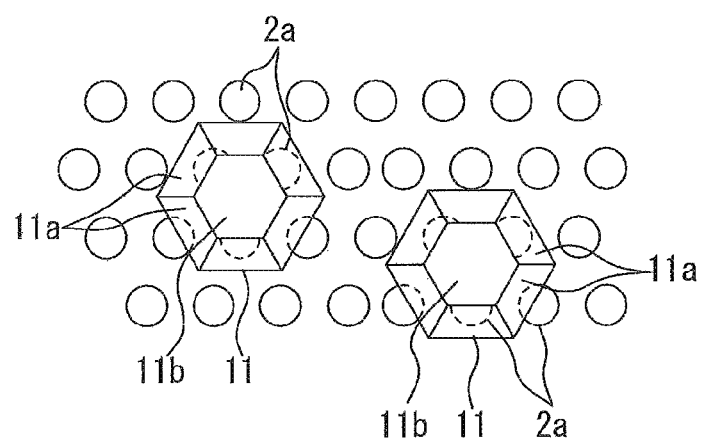
FIG. 5 is a schematic planar view showing a state of formation of crystal nuclei.

Specifically, as illustrated in FIG. 1, each crystal nucleus 11 has a plurality of side surfaces 11a formed of facet surfaces and a flat upper surface 11b. In the present embodiment, the upper surface 11b is the c-plane of GaN. Each crystal nucleus 11 has a hexagonal shape in a plan view and has a trapezoidal shape in a cross-sectional view. As illustrated in FIG. 5, each crystal nucleus 11 is formed so as to include at least one protrusion 2c. Moreover, the crystal nuclei 11 are separated from each other, and a planar portion of the buffer layer 10 and some protrusions 2c are exposed before the planarization layer 12 is formed.

Figure 4:
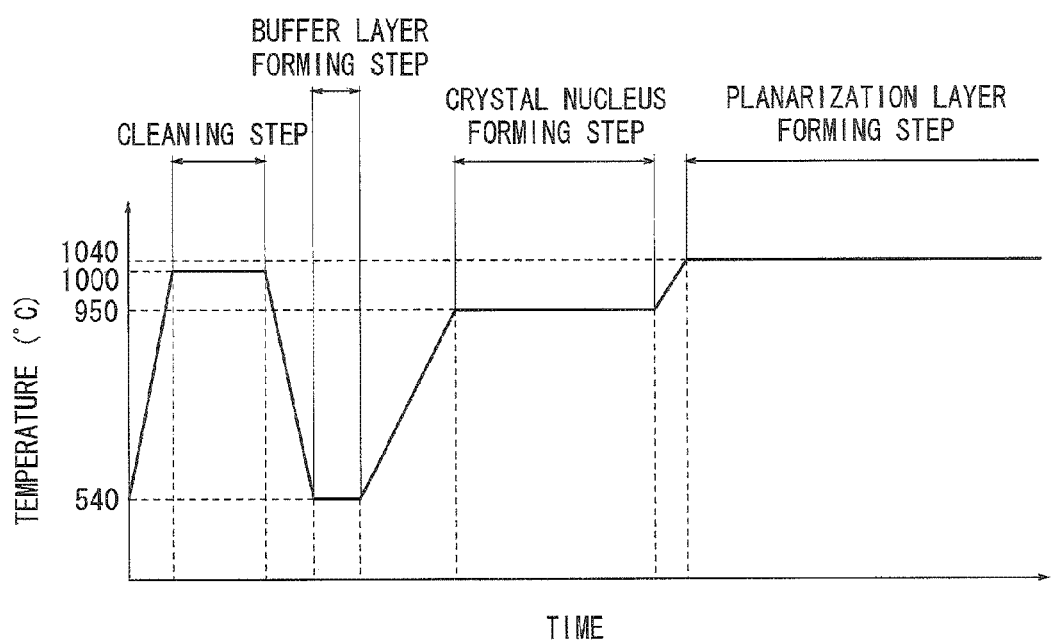
FIG. 4 is an example of a chart illustrating a change in a growth temperature in an initial stage of growth of a group-III nitride semiconductor.

FIG. 4 is an example of a chart illustrating a change in a growth temperature in an initial stage of growth of a group-III nitride semiconductor.

As illustrated in FIG. 4, in the present embodiment, the buffer layer 10 is grown at a lower temperature than the growth temperature of the planarization layer 12. After that, the respective crystal nuclei 11 are grown at a temperature higher than the growth temperature of the buffer layer 10 and lower than the growth temperature of the planarization layer 12. The planarization layer 12 is grown after the respective crystal nuclei 11 are grown. In order to create growth conditions advantageous to formation of facets, a method of lowering the temperature inside a reactor, increasing the pressure inside the reactor, decreasing the amount of $NH_3$ supplied, decreasing the amount of $(CH_3)_3Ga$ supplied, or lowering the V/III ratio may be used. When the respective crystal nuclei 11 are formed under prescribed conditions, it is possible to form a semiconductor laminated part 19 having satisfactory crystal quality without being influenced by the period of the protrusions 2c.

The buffer layer 10 can be formed by supplying 2200 sccm of $NH_3$ and 20 sccm of $(CH_3)_3Ga$ while maintaining the V/III ratio at 1016 and the temperature inside the reactor at 540° C. for a predetermined time, for example. The crystal nuclei 11 can be formed by supplying 2200 sccm of $NH_3$ and 20 sccm of $(CH_3)_3Ga$ while maintaining the V/III ratio at 1016 and the temperature inside the reactor at 950° C. for a predetermined time, for example. Moreover, the planarization layer 12 can be formed by supplying 8000 sccm of $NH_3$ and 45 sccm of $(CH_3)_3Ga$ while maintaining the V/III ratio at 1016 and the temperature in the reactor at 1040° C. for a predetermined time, for example. That is, the growth conditions of the crystal nuclei 11 can be obtained just by increasing the temperature inside the reactor with respect to the growth conditions of the buffer layer 10. Moreover, the growth conditions of the planarization layer 12 can be obtained by increasing the amounts of $NH_3$ and $(CH_3)_3Ga$ supplied and increasing the temperature in the reactor without changing the V/III ratio with respect to the growth conditions of the crystal nuclei 11.

Here, it was confirmed on a plurality of samples A to F that the crystal nuclei 11 were separated from each other in a state in which the protrusions 2c were formed on the front surface of the sapphire substrate 2. For all samples, the height of the protrusions 2c of the sapphire substrate 2 was 400 nm and the period was 460 nm.

Sample A was prepared by supplying 2200 sccm of $NH_3$ and 20 sccm of $(CH_3)_3Ga$ while maintaining the V/III ratio at 1016 and the temperature in the reactor at 900° C. Sample B was prepared by supplying 2200 sccm of $NH_3$ and 20 sccm of $(CH_3)_3Ga$ while maintaining the V/III ratio at 1016 and the temperature in the reactor at 950° C. Sample C was prepared by supplying 2200 sccm of $NH_3$ and 20 sccm of $(CH_3)_3Ga$ while maintaining the V/III ratio at 1016 and the temperature in the reactor at 965° C. Sample D was prepared by supplying 2200 sccm of $NH_3$ and 20 sccm of $(CH_3)_3Ga$ while maintaining the V/III ratio at 1016 and the temperature in the reactor at 980° C. Sample E was prepared by supplying 1100 sccm of $NH_3$ and 10 sccm of $(CH_3)_3Ga$ while maintaining the V/III ratio at 1016 and the temperature in the reactor at 900° C. Sample F was prepared by supplying 1100 sccm of $NH_3$ and 20 sccm of $(CH_3)_3Ga$ while maintaining the V/III ratio at 508 and the temperature in the reactor at 900° C.

Figure 6:
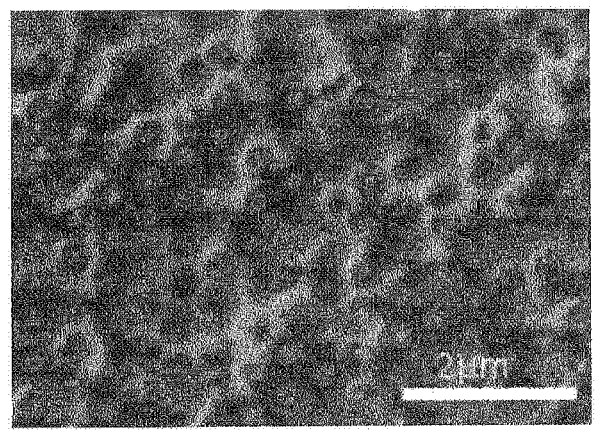
FIG. 6 illustrates a SEM image of Sample A.
Figure 7:
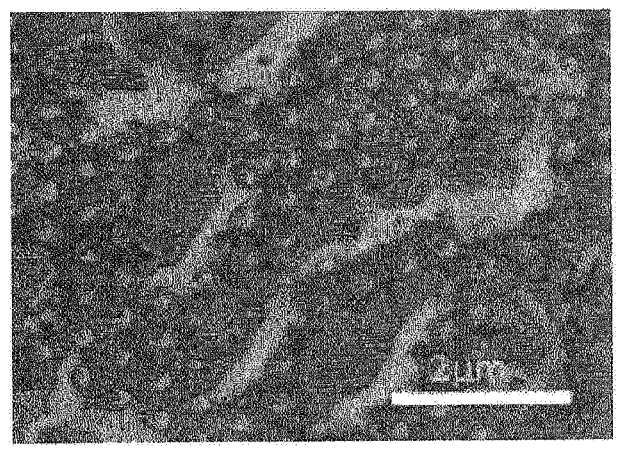
FIG. 7 illustrates a SEM image of Sample B.
Figure 8:
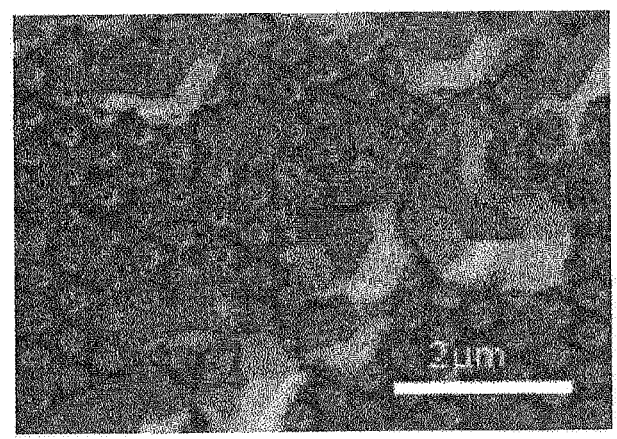
FIG. 8 illustrates a SEM image of Sample C.
Figure 9:
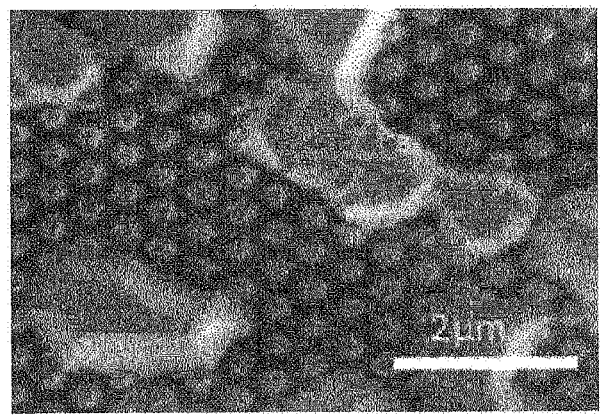
FIG. 9 illustrates a SEM image of Sample D.
Figure 10:
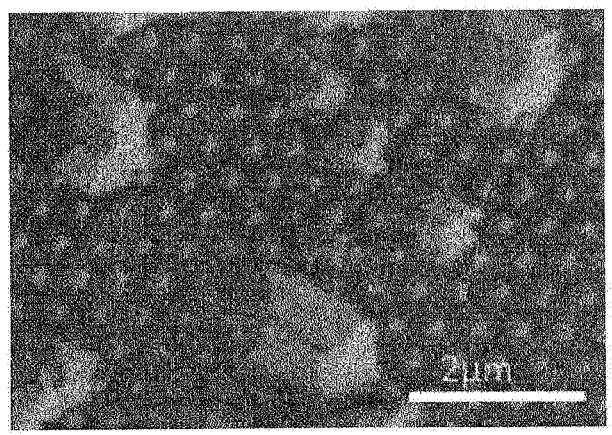
FIG. 10 illustrates a SEM image of Sample E.
Figure 11:
FIG. 11 illustrates a SEM image of Sample F.

FIG. 6 illustrates a SEM image of Sample A, FIG. 7 illustrates a SEM image of Sample B, FIG. 8 illustrates a SEM image of Sample C, FIG. 9 illustrates a SEM image of Sample D, FIG. 10 illustrates a SEM image of Sample E, and FIG. 11 illustrates a SEM image of Sample F.

As illustrated in FIGS. 6 to 9, as the growth temperature of the crystal nuclei 11 increases, the height and the size in a plan view of the crystal nuclei 11 increase and the density of the crystal nuclei 11 decreases. Specifically, the height of the crystal nuclei 11 of Sample A is 200 nm to 400 nm and an average size in a plan view is 14 $\mu m^2$, the proportion of the protrusions 2c which are not included in the crystal nuclei 11 and are in an exposed state is 7%, and the proportion of the area covered by the crystal nuclei 11 at the front surface of sapphire substrate 2 side is 39%. Moreover, the height of the crystal nuclei 11 of Sample B is 780 nm to 820 nm and an average size in a plan view is 53 $\mu m^2$, the proportion of the protrusions 2c which are not included in the crystal nuclei 11 and are in an exposed state is 27%, and the proportion of the area covered by the crystal nuclei 11 at the front surface of sapphire substrate 2 side is 20%. Moreover, the height of the respective crystal nuclei 11 of Sample C is 980 nm to 1200 nm and an average size in a plan view is 76 $\mu m^2$, the proportion of the protrusions 2c which are not included in the crystal nuclei 11 and are in an exposed state is 61%, and the proportion of the area covered by the crystal nuclei 11 at the front surface of sapphire substrate 2 side is 17%. Moreover, the height of the respective crystal nuclei 11 of Sample D is 1500 nm to 1700 nm and an average size in a plan view is 106 $\mu m^2$, the proportion of the protrusions 2c which are not included in the crystal nuclei 11 and are in an exposed state is 76%, and the proportion of the area covered by the crystal nuclei 11 at the front surface of sapphire substrate 2 side is 16%. As a result, it can be understood that when the growth temperature of the crystal nuclei 11 is increased, the proportion of the protrusions 2c which are not included in the crystal nuclei 11 and are in an exposed state increases and the proportion of the area covered by the crystal nuclei 11 at the front surface of sapphire substrate 2 side decreases.

As illustrated in FIGS. 6 and 10, when the growth rate of the crystal nuclei 11 is decreased, the height and the size in a plan view of the crystal nuclei 11 increase and the density of the crystal nuclei 11 decreases. Moreover, when the growth rate of the crystal nuclei 11 is decreased, the proportion of the protrusions 2c which are not included in the crystal nuclei 11 and are in an exposed state increases and the proportion of the area covered by the crystal nuclei 11 at the front surface of sapphire substrate 2 side decreases.

Moreover, as illustrated in FIGS. 6 and 11, when the V/III ratio during growth of the crystal nuclei 11 is decreased, the height and the size in a plan view of the crystal nuclei 11 increase and the density of the crystal nuclei 11 decreases. Moreover, when the growth rate of the crystal nuclei 11 is decreased, the proportion of the protrusions 2c which are not included in the crystal nuclei 11 and are in an exposed state increases, and the proportion of the area covered by the crystal nuclei 11 at the front surface of sapphire substrate 2 side decreases.

Figure 13:
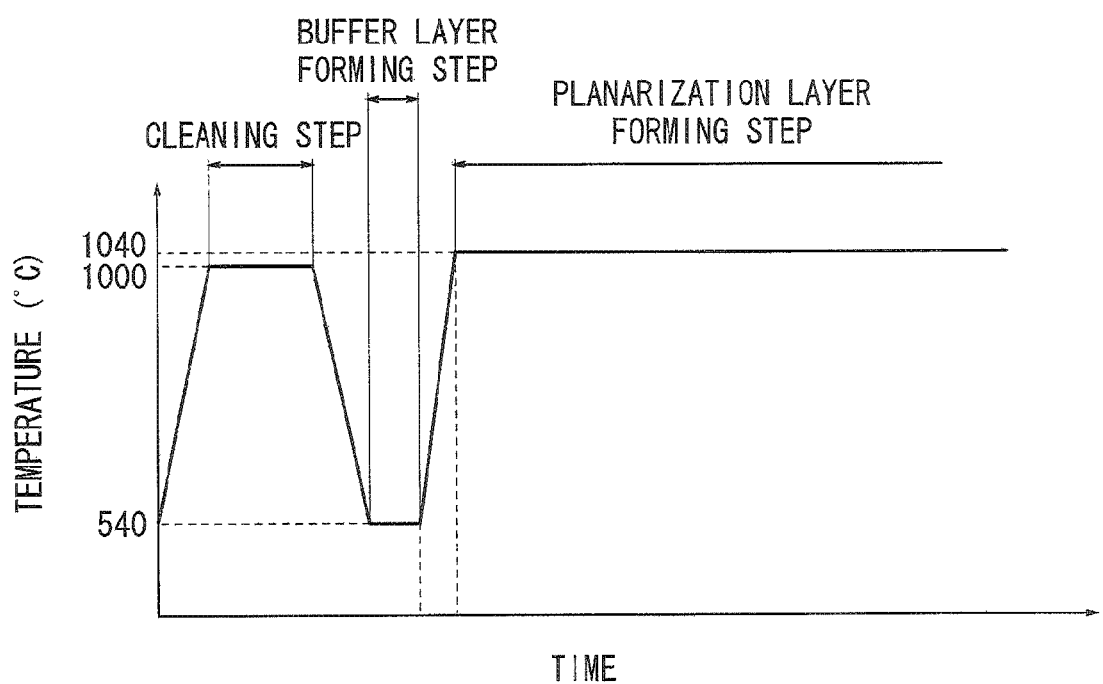
FIG. 13 is an example of a chart illustrating a change in a growth temperature in an initial stage of growth of a group-III nitride semiconductor in case of not forming crystal nuclei.

FIG. 12 is a graph illustrating the relation between the pitch of protrusions and a threading dislocation density in a sample in which crystal nuclei are formed and a sample in which crystal nuclei are not formed. Sample B was manufactured such temperature conditions as illustrated in FIG. 4 as a sample in which crystal nuclei are formed. Specifically, Sample B was manufactured through a cleaning step S1, a buffer layer growth step S2, a crystal nucleus forming step S3, and a planarization layer forming step S4. Although the temperature conditions and the growth time in the respective steps are arbitrary, the specific temperature and time used in manufacturing of samples are as follows. In the cleaning step S1, the temperature in the reactor was maintained at 1000° C. for 10 minutes. Moreover, in the buffer layer growth step S2, the buffer layer 10 was grown while maintaining the temperature in the reactor at 540° C. for 2 minutes. Moreover, in the crystal nucleus forming step S3, the crystal nuclei 11 were grown while maintaining the temperature in the reactor at 950° C. for 30 minutes. Moreover, in the planarization layer forming step S4, the planarization layer 12 was grown while maintaining the temperature in the reactor 1040° C. for 60 minutes. As for Sample G in which crystal nuclei are not formed, as illustrated in FIG. 13, the planarization layer forming step S4 was performed subsequently to the buffer layer forming step S2 without performing the crystal nucleus forming step S3. The growth conditions of the buffer layer 10 and the planarization layer 12 were the same as those of Sample B in which crystal nuclei were formed.

As illustrated in FIG. 12, when the crystal nuclei 11 were formed, the threading dislocation density was substantially constant regardless of the pitch of the protrusions 2c. In contrast, when the crystal nuclei 11 were not formed, the smaller the pitch of the protrusions 2c, the larger the threading dislocation density was. The reason why the threading dislocation density increases when the crystal nuclei 11 are not formed is considered to be attributable to the fact that the presence of the protrusions 2c interferes a migration of Ga atoms in the planarization layer 12, and as a result, small nuclei are formed in high density and it is difficult to decrease the dislocation density.

Moreover, when the oxygen concentrations in the crystal nuclei 11 and the planarization layer 12 were measured, the oxygen concentration in the crystal nuclei 11 was higher than that of the planarization layer 12 in all samples. Specifically, $1\times10^{17}/cm^3$ of oxygen was detected in the crystal nuclei 11 whereas oxygen was not detected in the planarization layer 12. Since an apparatus of which the oxygen detection limit is $5\times10^{16}/cm^3$ was used for the measurement, it can be said that the oxygen concentration in the planarization layer 12 is smaller than $5\times10^{16}/cm^3$. That is, whether the crystal nuclei 11 are used during growth of the semiconductor laminated part 19 can be detected by examining the oxygen concentration in the semiconductor laminated part 19.

FIG. 14 is a graph illustrating the relation between the largest height of the crystal nuclei and the threading dislocation density. The relation between the height of the crystal nuclei 11 and the threading dislocation density was examined using Sample G in which the crystal nuclei 11 are not formed and the height of the crystal nuclei 11 can be regarded as 0 nm, Sample A in which the height of the crystal nuclei 11 is 200 nm to 400 nm, Sample B in which the height of the crystal nuclei 11 is 780 nm to 820 nm, Sample C in which the height of the crystal nuclei 11 is 980 nm to 1200 nm, and Sample D in which the height of the crystal nuclei 11 is 1500 nm to 1700 nm.

As illustrated in FIG. 14, it can be understood that the threading dislocation density decreases sufficiently when the height of at least one of the crystal nuclei 11 is higher than that of the protrusions 2c.

Whether the thickness of the semiconductor laminated part 19 is as flat as 3.0 μm was observed for Samples A to D and G. The thickness was flat for Samples A, B, and G in which the heights of the crystal nuclei 11 were 0 nm, 200 nm to 400 nm, and 780 nm to 820 nm, respectively. However, a slightly large number of surface pits were observed for Sample C in which the thickness was 980 nm to 1200 nm and many surface pits were observed for Sample D in which the thickness was 1500 nm to 1700 nm. In this respect, it is preferable that the height of the crystal nuclei is 900 nm or smaller from the flatness perspective of the semiconductor laminated part 19.

As described above, since the crystal nuclei 11 are formed before the planarization layer 12 is formed, it is possible to control the threading dislocation density of the semiconductor laminated part 19 to be substantially constant regardless of the period of the protrusions 2c. Particularly, as in the present embodiment, when the period of the protrusions 2c is 1000 nm or smaller, it is possible to decrease the threading dislocation density relatively greatly.

Particularly, in the present embodiment, since the upper surface of the crystal nuclei 11 is formed flat, the thickness can be decreased until the planarization layer 12 becomes flat. Moreover, since the respective crystal nuclei 11 are separated from each other, the density of crystal nuclei on the substrate is small and there are a small number of sources of dislocation. Therefore, it is possible to reduce a defect density in the planarization layer 12 formed subsequently.

Figure 15:
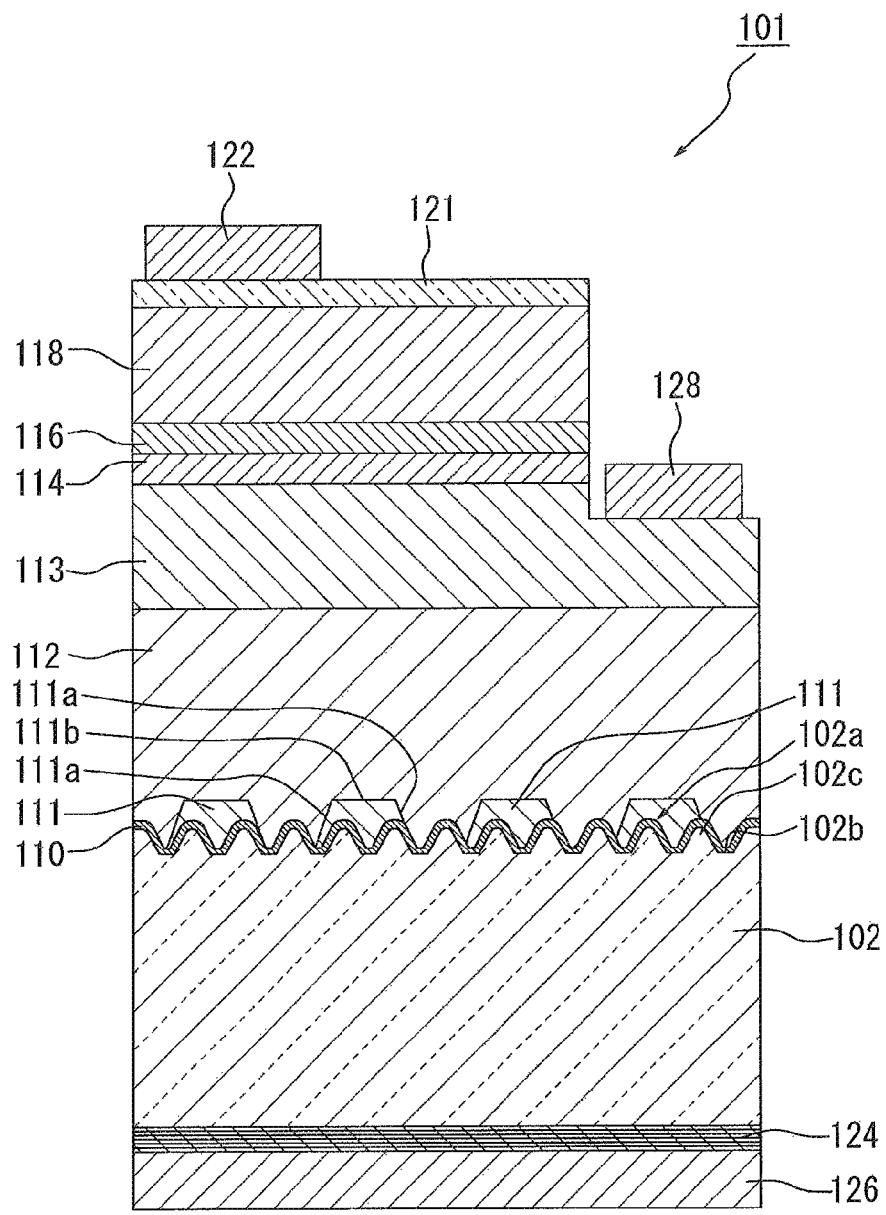
FIG. 15 is a schematic sectional view of a LED element according to a modified example.

In the embodiment, although the LED element 1 which is a flip-chip-type LED element has been illustrated, a face-up-type LED element 101 may naturally be used as illustrated in FIG. 15, for example. A semiconductor laminated part 119 of the LED element 101 has a buffer layer 110, crystal nuclei 111, a planarization layer 112, an n-type GaN layer 113, a light emitting layer 114, an electron blocking layer 116, and a p-type GaN layer 118 which are disposed in this order from the side of a sapphire substrate 102. A p-side electrode 127 is formed on the p-type GaN layer 118, and an n-side electrode 128 is formed on the n-type GaN layer 113.

In the LED element 101 shown in FIG. 15, the front surface of the sapphire substrate 102 forms a verticalized moth eye surface 102a. A planar part 102b and the plurality of protrusions 102c that are periodically formed on the planar part 102b are formed on the front surface of the sapphire substrate 102. The p-side electrode 127 includes a diffusion electrode 121 that is formed on the p-type GaN layer 118 and a pad electrode 122 that is formed on a part of the diffusion electrode 121. The n-side electrode 128 is formed on the n-type GaN layer 113 exposed after etching the p-type GaN layer 118 to form the n-type GaN layer 113.

As illustrated in FIG. 15, a dielectric multilayer film 124 is formed on the back surface of the sapphire substrate 102. The dielectric multilayer film 124 is formed by repeatedly laminating a plurality of pairs of a first material and a second material having different indices of refraction. The dielectric multilayer film 124 is covered by an Al layer 126 which is a metal layer. In this light emitting element 101, the dielectric multilayer film 124 and the Al layer 126 form a reflecting part, and light emitted from the light emitting layer 114 and transmitted through the verticalized moth eye surface 102a by the diffraction effect is reflected from the reflecting part. The light transmitted by the diffraction effect is incident on the verticalized moth eye surface 102a again and is transmitted through the verticalized moth eye surface 102a again by the diffraction effect, whereby the light can be extracted outside the element in a plurality of modes.

In the LED element 101 having the above-described configuration, since the crystal nuclei 111 are formed before the planarization layer 112 is formed, it is possible to control the threading dislocation density of the semiconductor laminated part 119 to be substantially constant regardless of the period of the protrusions 102c.

Moreover, in the above-described embodiment, although the sapphire substrate 2 is used as the substrate of the LED element 1, another substrate may naturally be used. Moreover, although the u-type GaN planarization layer 12 and the n-type GaN layer 13 are formed sequentially after the crystal nuclei 11 are formed, the n-type GaN layer 13 may be formed after the crystal nuclei 11 are formed, for example. In this case, the n-type GaN layer 13 also performs the role of a planarization layer.

While the embodiments of the present invention has been described, the embodiments described above do not limit the inventions disclosed in the claims. It should also be noted that all combinations of the features explained in the embodiments are not necessarily essential to the means for solving the problem in the invention.

INDUSTRIAL APPLICABILITY

The present invention are industrially useful because a change in the crystal quality of a group-III nitride semiconductor depending on the pitch of recesses or protrusions can be suppressed even when a substrate having recesses or protrusions formed in a front surface thereof in a period as to form a diffractive surface is used.

REFERENCE SIGNS LIST

1 LED element
2 Sapphire substrate
2a Verticalized moth eye surface
2b Planar part
2c Protrusion
2d Side surface
2e Bent part
2f Top surface
2g Transmission moth eye surface
2h Planar part
2i Protrusion
10 Buffer layer
11 Crystal nucleus
12 Planarization layer
13 n-type GaN layer
14 Light emitting layer
16 Electron blocking layer
18 p-type GaN layer
19 Semiconductor laminated part
21 Diffusion electrode
22 Dielectric multilayer film
22a Via-hole
23 Metal electrode
24 Diffusion electrode
25 Dielectric multilayer film
25a Via-hole
26 Metal electrode
27 p-side electrode
28 n-side electrode
101 LED element
102 Sapphire substrate
102a Verticalized moth eye surface
110 Buffer layer
111 Crystal nucleus
112 Planarization layer
113 n-type GaN layer
114 Light emitting layer
116 Electron blocking layer
118 p-type GaN layer
119 Semiconductor laminated part
122 Pad electrode
124 Dielectric multilayer film
126 Al layer
127 p-side electrode
128 n-side electrode

The invention claimed is:
1. A light emitting element manufacturing method of allowing a semiconductor laminated part which includes a light emitting layer and comprises a group-III nitride semiconductor to grow on a substrate surface in which protrusions are formed in a period which is larger than an optical wavelenth of light emitted from the light emitting layer and is smaller than a coherent length of the light, the method comprising:
   forming a buffer layer along the substrate surface having the protrusions;
   allowing crystal nuclei which have facet surfaces and are separated from each other to grow on the buffer layer such that the crystal nuclei include at least one protrusion and are grown to a height of 900 nm or smaller; and
   allowing a planarization layer to grow on the buffer layer in which the crystal nuclei are formed, wherein
   the crystal nuclei have a flat upper surface.

2. A light emitting element manufacturing method of allowing a semiconductor laminated part which includes a light emitting layer and comprises a group-III nitride semiconductor to grow on a substrate surface in which protrusions are formed in a period which is larger than an optical wavelength of light emitted from the light emitting layer and is smaller than a coherent length of the light, the method comprising:
   forming a buffer layer along the substrate surface having the protrusions;
   allowing crystal nuclei which have facet surfaces and are separated from each other to grow on the buffer layer such that the crystal nuclei include at least one protrusion and are grown to a height of 900 nm or smaller; and
   allowing a planarization layer to grow on the buffer layer in which the crystal nuclei are formed, wherein
   the buffer layer is formed by sputtering which uses AlN as a target.

3. A light emitting element manufacturing method of allowing a semiconductor laminated part which includes a light emitting layer and comprises a group-III nitride semiconductor to grow on a substrate surface in which protrusions are formed in a period which is larger than an optical wavelength of light emitted from the light emitting layer and is smaller than a coherent length of the light, the method comprising:
   forming a buffer layer along the substrate surface having the protrusions;
   allowing crystal nuclei which have facet surfaces and are separated from each other to grow on the buffer layer such that the crystal nuclei include at least one protrusion and are grown to a height of 900 nm or smaller; and
allowing a planarization layer to grow on the buffer layer in which the crystal nuclei are formed, wherein
   the semiconductor laminated part includes the buffer layer, the crystal nuclei and the planarization layer; and
   an oxygen concentration in the crystal nuclei is higher than that of the planarization layer.

4. The light emitting element manufacturing method according to claim 1, wherein
   the buffer layer is formed by sputtering which uses AlN as a target.

5. A light emitting element manufactured by the light emitting element manufacturing method according to claim 1, wherein
   the semiconductor laminated part includes the buffer layer, the crystal nuclei and the planarization layer; and
   an oxygen concentration in the crystal nuclei is higher than that of the planarization layer.

6. A light emitting element manufactured by the light emitting element manufacturing method according to claim 2, wherein the semiconductor laminated part includes the buffer layer, the crystal nuclei and the planarization layer; and
an oxygen concentration in the crystal Gnuclei is higher than that of the planarization layer.

* * * * *